United States Patent
Lu et al.

(10) Patent No.: US 12,432,903 B2
(45) Date of Patent: Sep. 30, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Yong Lu, Hefei (CN); Zhicheng Shi, Hefei (CN); Xinran Liu, Hefei (CN); Ruiqi Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 467 days.

(21) Appl. No.: 18/152,168

(22) Filed: Jan. 10, 2023

(65) Prior Publication Data

US 2023/0225104 A1 Jul. 13, 2023

Related U.S. Application Data

(63) Continuation of application No. PCT/CN2022/082211, filed on Mar. 22, 2022.

(30) Foreign Application Priority Data

Jan. 12, 2022 (CN) .......................... 202210029907.5

(51) Int. Cl.
*H01L 21/762* (2006.01)
*H01L 21/764* (2006.01)
(Continued)

(52) U.S. Cl.
CPC ..... *H10B 12/053* (2023.02); *H01L 21/76289* (2013.01); *H01L 21/764* (2013.01);
(Continued)

(58) Field of Classification Search
None
See application file for complete search history.

(56) References Cited

U.S. PATENT DOCUMENTS

2014/0329378 A1 11/2014 Hung et al.
2015/0221742 A1* 8/2015 Yi .................... H10B 12/315
257/295
(Continued)

FOREIGN PATENT DOCUMENTS

CN 101916720 A 12/2010
CN 105405890 A 3/2016
(Continued)

*Primary Examiner* — Kretelia Graham
*Assistant Examiner* — William Henry Anderson
(74) *Attorney, Agent, or Firm* — Kilpatrick Townsend & Stockton LLP

(57) ABSTRACT

Embodiments provide a semiconductor structure and a fabricating method. The semiconductor structure includes: a substrate, where a trench is formed in the substrate; a conductive layer positioned in the trench, where the conductive layer includes a first conductive layer and a second conductive layer, the second conductive layer is positioned on the first conductive layer, and a projection area of a bottom of the second conductive layer within the trench is greater than a projection area of a top of the first conductive layer within the trench; a dielectric layer positioned between the conductive layer and an inner wall of the trench, where a top of the dielectric layer is lower than the top of the first conductive layer; an isolation layer positioned on the conductive layer; and a void defined by the isolation layer, the conductive layer, the dielectric layer, and a side wall of the trench.

9 Claims, 10 Drawing Sheets

(51) Int. Cl.
*H01L 21/768* (2006.01)
*H10B 12/00* (2023.01)
*H10D 62/10* (2025.01)
*H10D 64/66* (2025.01)

(52) U.S. Cl.
CPC ......... *H01L 21/7682* (2013.01); *H10B 12/34* (2023.02); *H10D 62/116* (2025.01); *H10D 64/679* (2025.01); *H01L 2221/1042* (2013.01); *H01L 2221/1063* (2013.01)

(56) References Cited

U.S. PATENT DOCUMENTS

| | | | |
|---|---|---|---|
| 2019/0006484 A1* | 1/2019 | Wu | H01L 21/32139 |
| 2019/0115351 A1* | 4/2019 | Jeon | H10B 12/0335 |
| 2021/0066466 A1* | 3/2021 | Kwon | H10D 64/687 |
| 2022/0367475 A1* | 11/2022 | Wei | H10B 12/315 |
| 2024/0032278 A1* | 1/2024 | Tsai | H01L 21/76834 |

FOREIGN PATENT DOCUMENTS

| | | |
|---|---|---|
| CN | 111430348 A | 7/2020 |
| CN | 111508841 A | 8/2020 |
| CN | 113707610 A | 11/2021 |

\* cited by examiner

SEMICONDUCTOR STRUCTURE AND METHOD FOR FABRICATING SAME

CROSS-REFERENCE TO RELATED APPLICATION

The present disclosure is a continuation of PCT/CN2022/082211, filed on Mar. 22, 2022, which claims priority to Chinese Patent Application No. 2022100299075 filed to the State Patent Intellectual Property Office on Jan. 12, 2022, the entire contents of which are incorporated herein by reference.

TECHNICAL FIELD

The present disclosure relates to the field of semiconductor technology, and more particularly, to a semiconductor structure and a method for fabricating the same.

BACKGROUND

A metal oxide semiconductor (MOS) transistor is an important component in fabrication of integrated circuits. Generally, the MOS transistor is formed on a substrate. The MOS transistor includes a gate structure, a source region and a drain region are formed in the substrate on two sides of the gate structure by means of implantation, and a current flowing between the source region and the drain region is controlled by controlling a voltage applied to the gate structure.

A metal oxide semiconductor (MOS) transistor may be configured to form a memory, as, for example, an access transistor of a dynamic random access memory (DRAM). A source region is connected to a bit line, and a drain region is connected to a storage capacitor. The storage capacitor is generally configured to store charges representing storage information. By controlling on and off of the MOS transistor, data information stored in the storage capacitor is read by means of the bit line, or the data information is written into the storage capacitor.

At present, a buried word line (BW) is generally used in an access transistor of a DRAM device, but gate-induced drain leakage (GIDL) is easy to occur when the BW is fabricated. That is, when the voltage is applied to the drain region, a PN junction in the drain region is biased reversely, and surplus hole-electron pairs generated by electrothermal energy are driven by an electric field before recombination, resulting in phenomenon of electric leakage. The GIDL may become more and more obvious with dimension decrease of the DRAM device and thinning of a gate oxide layer, and excessive GIDL may reduce reliability of the DRAM device and increase power consumption of the DRAM device, which may adversely affect data storage and read/write of the DRAM device.

SUMMARY

According to various embodiments of the present disclosure, a semiconductor structure and a method for fabricating the same are provided.

According to some embodiments, an aspect of the present disclosure provides a semiconductor structure, which includes: a substrate, where a trench is formed in the substrate; a conductive layer positioned in the trench, the conductive layer comprising a first conductive layer and a second conductive layer, where the second conductive layer is positioned on the first conductive layer, and a projection area of a bottom of the second conductive layer within the trench is greater than a projection area of a top of the first conductive layer within the trench; a dielectric layer positioned between the conductive layer and an inner wall of the trench, where a top of the dielectric layer is lower than the top of the first conductive layer; an isolation layer positioned on the conductive layer; and a void defined by the isolation layer, the conductive layer, the dielectric layer, and a side wall of the trench.

According to some embodiments, another aspect of the present disclosure discloses a method for fabricating a semiconductor structure, which includes: providing a substrate, where a trench is formed in the substrate; sequentially forming a dielectric layer and a conductive layer in the trench, where the dielectric layer is positioned between the conductive layer and an inner wall of the trench; and the conductive layer comprises a first conductive layer and a second conductive layer positioned on the first conductive layer, a top of the dielectric layer is lower than a top of the first conductive layer, a projection area of a bottom of the second conductive layer within the trench is greater than a projection area of the top of the first conductive layer within the trench, and a work function of the first conductive layer is greater than a work function of the second conductive layer; and forming an isolation layer on the conductive layer, where the isolation layer, the conductive layer, the dielectric layer, and a side wall of the trench define a void.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
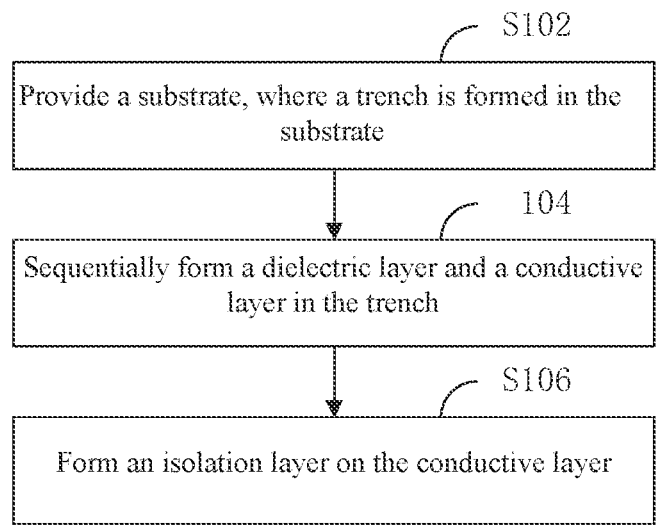
FIG. 1 is a schematic flowchart of a method for fabricating a semiconductor structure in an embodiment.

For ease of understanding the embodiments of the present disclosure, the embodiments of the present disclosure will be described more fully hereinafter with reference to the accompanying drawings. Some embodiments among the embodiments of the present disclosure are provided in the accompanying drawings. However, the embodiments of the present disclosure may be embodied in many different forms and should not be limited to the embodiments set forth herein. Rather, these embodiments are provided such that disclosed contents of the embodiments of the present disclosure will be more thorough and complete.

Unless otherwise defined, all technical and scientific terms employed herein have the same meaning as commonly understood by those skilled in the art to which the embodiments of the present disclosure belong. The terms used in the specification of the embodiments of the present disclosure are merely for the objective of describing some embodiments and are not intended for limiting the embodiments of the present disclosure. As used herein, the term "and/or" includes any and all combinations of one or more of the associated listed items.

In the description of the embodiments of the present disclosure, it is to be understood that the orientations or positions represented by the terms of "up", "down", "vertical", "horizontal", "in", "out", and the like are based on the orientations or positions as shown in the accompanying figures, they are merely for ease of a description of the embodiments of the present disclosure and a simplified description instead of being intended to indicate or imply the device or element to have a special orientation or to be configured and operated in a special orientation. Thus, they cannot be interpreted as limiting of the embodiments of the present disclosure.

It is to be understood that the terms "first", "second", etc. used in the present disclosure may be used herein to describe various elements, but these elements are not limited by these terms. These terms are only intended for distinguishing a first element from another one. For example, without departing from the scope of the present disclosure, a first conductive layer may be termed a second conductive layer, and similarly the second conductive layer may be termed the first conductive layer. Both the first conductive layer and the second conductive layer are conductive layers, but they are not the same conductive layer.

In addition, terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, for example, two, three, etc., unless otherwise expressly specified. In the description of the present disclosure, "a number of" refers to at least one, for example, one, two, etc., unless otherwise expressly specified.

FIG. 1 is a schematic flowchart of a method for fabricating a semiconductor structure in an embodiment. As shown in FIG. 1, in an embodiment of the present disclosure, a method for fabricating a semiconductor structure is provided, which includes following steps.

Step S102: providing a substrate, where a trench is formed in the substrate.

In some embodiments, a substrate in which a trench is formed is provided, where the substrate may use undoped single crystal silicon, single crystal silicon doped with impurities, silicon-on-insulator (SOI), stacked silicon-on-insulator (SSOI), stacked silicon-germanium-on-insulator (S—SiGeOI), silicon-germanium-on-insulator (SiGeOI), and germanium-on-insulator (GeOI), etc. As an example, in this embodiment, single crystal silicon is selected as a material for forming the substrate.

Step S104: sequentially forming a dielectric layer and a conductive layer in the trench.

The dielectric layer and the conductive layer are sequentially formed in the trench, where the dielectric layer is positioned between the conductive layer and an inner wall of the trench. The conductive layer comprises a first conductive layer and a second conductive layer positioned on the first conductive layer. A top of the dielectric layer is lower than a top of the first conductive layer, a projection area of a bottom of the second conductive layer within the trench is greater than a projection area of the top of the first conductive layer within the trench, and a work function of the first conductive layer is greater than a work function of the second conductive layer. In some embodiments, the dielectric layer covers part of the side wall of the trench close to the bottom and the bottom of the trench, and the conductive layer is filled between the dielectric layers on the side wall. The upper surface of the conductive layer is higher than that of the dielectric layer. From the bottom of the trench to the opening direction of the trench, the conductive layer includes the first conductive layer close to the bottom of the trench and the second conductive layer close to the top of the trench. The first conductive layer is electrically connected to the second conductive layer, and the area of the orthographic projection of the bottom of the second conductive layer within the trench is greater than that of the top of the first conductive layer within the trench. That is, in the direction parallel to the upper surface of the substrate, the cross-sectional area of the bottom of the second conductive layer is greater than that of the top of the first conductive layer. For those skilled in the art, when the semiconductor structure includes a memory device, the conductive layer serves as a gate of the memory transistor, and moreover, the conductive layer may serve as a word line structure of the memory device. It is to be understood that, the side wall of the second conductive layer is isolated from that of the trench.

Step S106: forming an isolation layer on the conductive layer.

The isolation layer is formed on the conductive layer, where the isolation layer, the conductive layer, the dielectric layer, and a side wall of the trench define a void. In some embodiments, the isolation layer is formed on the conductive layer. The isolation layer is in contact with the side wall of the trench. In this case, the void is formed in an unfilled part of space defined by the isolation layer, the conductive layer, the dielectric layer, and the side wall of the trench. In this case, the void and the dielectric layer jointly serve as the gate dielectric layer of the memory transistor, thereby reducing the drain-to-gate voltage, effectively inhibiting the GIDL, improving the reliability of the semiconductor structure, and reducing the power consumption of the semiconductor structure. When the semiconductor structure is a memory device, data storage and read/write performance of the memory device is improved.

The method for fabricating the semiconductor structure comprises: providing a substrate, where a trench is formed in the substrate; sequentially forming a dielectric layer and a conductive layer in the trench, where the dielectric layer is positioned between the conductive layer and an inner wall of the trench; and the conductive layer comprises a first conductive layer and a second conductive layer positioned on the first conductive layer, a top of the dielectric layer is lower than a top of the first conductive layer, a projection area of a bottom of the second conductive layer within the trench is greater than a projection area of the top of the first conductive layer within the trench, and a work function of the first conductive layer is greater than a work function of the second conductive layer; and forming an isolation layer on the conductive layer, where the isolation layer, the conductive layer, the dielectric layer, and a side wall of the trench define a void. In the present disclosure, the conductive layer serving as a gate structure includes the first conductive layer and the second conductive layer, and the work function of the first conductive layer is greater than that of the second conductive layer. In this way, turn-on speed of the memory transistor is improved, gate-induced drain leakage of the semiconductor structure is reduced, reliability of the semiconductor structure is reduced, and power consumption of the semiconductor structure is reduced. When the semiconductor structure is a memory device, the data storage and read/write performance of the semiconductor structure is improved. Moreover, in the present disclosure, the gate dielectric layer of the memory transistor includes the void and the dielectric layer, thereby reducing the drain-to-gate voltage, inhibiting the GIDL, and achieving the objective of further improving the reliability of the semiconductor structure and reducing the power consumption of the semiconductor structure. Furthermore, the data storage and read/write performance of the semiconductor structure is further improved.

As an example, a shallow trench isolation structure is formed in the substrate, where the shallow trench isolation structure isolates a plurality of active areas arranged at intervals in the substrate, the trench is formed in each of the plurality of active areas, and a source/drain region is formed on two opposite sides of the trench respectively. In this embodiment, the source/drain region is formed simultaneously by doping the active areas, and may be further divided into the source region and the drain region according to the connection relationship in the transistor structure. The source region is connected to the bit line structure, and the drain region is connected to the storage capacitor. The active areas are arranged periodically in the substrate at certain intervals, and the trench formed in the active areas transversely penetrates through a plurality of active areas and the shallow trench isolation structure between the adjacent active areas. By forming the word line structure in the trench, the word line structure is connected to the plurality of active areas. It should be noted that, the present disclosure does not limit the formation sequence of the trench, the source/drain region, and the shallow trench isolation structure. For example, the trench may be formed on the substrate first, and the sacrificial layer is introduced to cover the trench, then the source/drain region is formed on the substrate by means of ion implantation. In addition, the mask material layer in the process of forming the trench may be a silicon dioxide layer, and may further include the amorphous carbon layer formed on the upper layer, to increase the etching selectivity during dry etching and remove the residual amorphous carbon layer after the dry etching.

As an example, the bottom of the void is not lower than the top of the source/drain region. That is, the bottom of the void is higher than or as high as the top of the source/drain region, and the void does not extend into the substrate on a lower layer of the source/drain region. The substrate and the conductive layer are separated by the dielectric layer. For example, the dielectric layer may be a silicon dioxide dielectric layer. In other embodiments of the present disclosure, the void may also extend further into the substrate on the lower layer of the source/drain region. That is, part of the region between the substrate and the conductive layer is isolated by the void. The above difference determines the composition of the isolation medium for the gate-drain overlapping region and part of the channel region of the transistor structure obtained in the present disclosure, and the selection of the isolation medium may have an important influence on the performance of the transistor such as GIDL and switching characteristics. In this embodiment, the isolation dielectric in the channel region may entirely comprise a silicon dioxide gate dielectric layer, which ensures that the device obtained has better switching characteristics.

Figure 2:
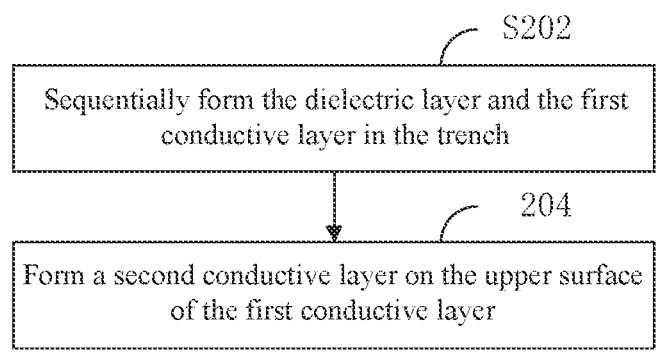
FIG. 2 is a schematic flowchart of Step S104 in an embodiment.

FIG. 2 is a schematic flowchart of Step S104 in an embodiment. As shown in FIG. 2, as an example, the void includes a first void and a second void, and Step S104 includes:

Step S202: sequentially forming the dielectric layer and the first conductive layer in the trench.

In some embodiments, the dielectric layer and the first conductive layer are sequentially formed in the trench, and a material of the dielectric layer includes, for example, at least one of silicon dioxide, silicon nitride, or silicon carbonitride. A material of the first conductive layer includes at least one of tungsten, polysilicon, or titanium nitride.

Figure 3:
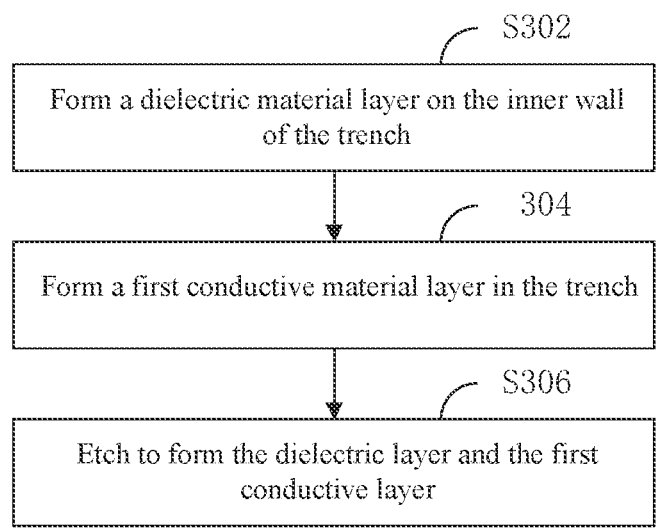
FIG. 3 is a schematic flow diagram of Step S202 according to one embodiment.
Figure 4:
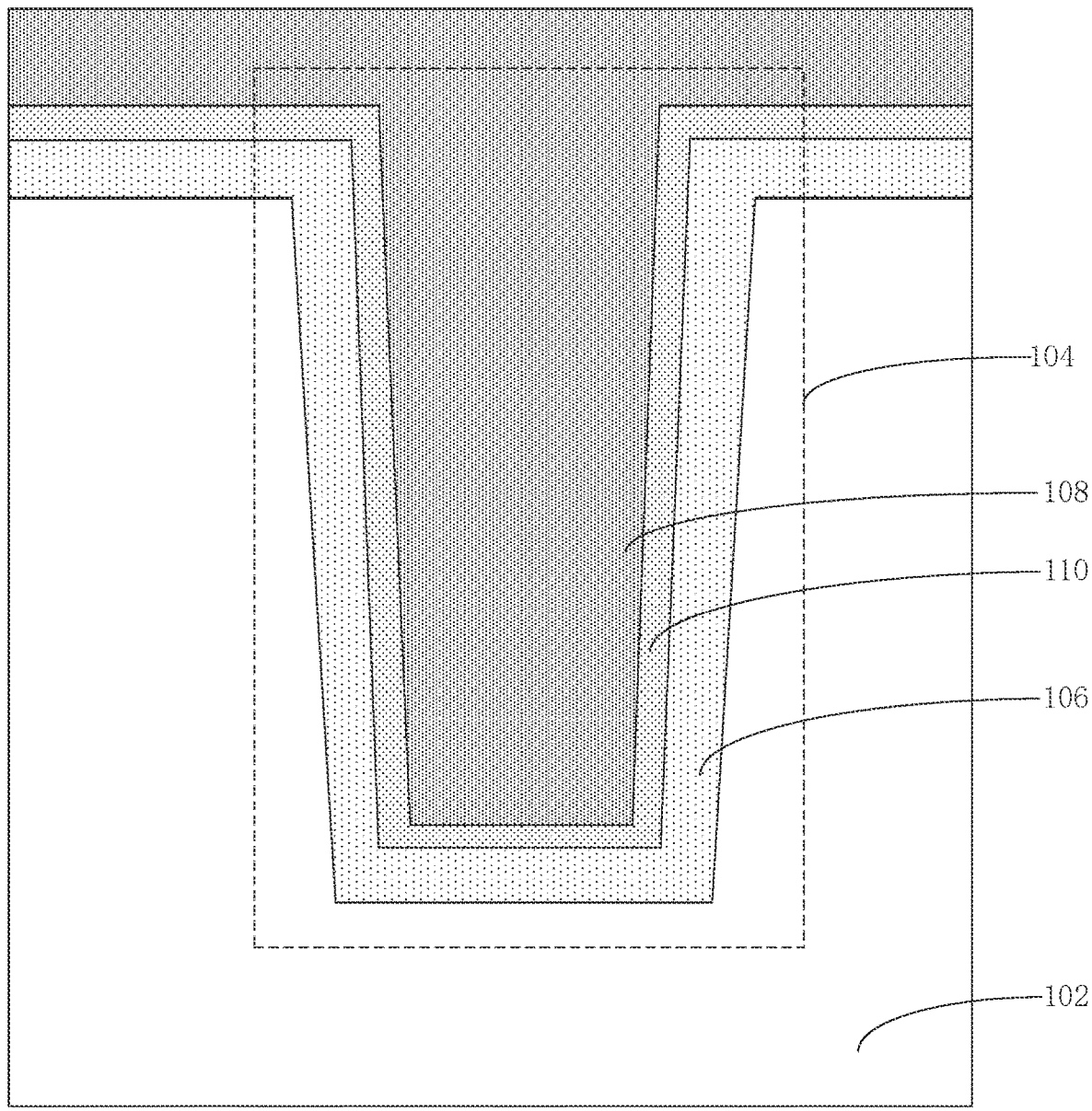
FIG. 4 is a schematic cross-sectional diagram of a semiconductor structure after a first conductive material layer is formed according to one embodiment.
Figure 5:
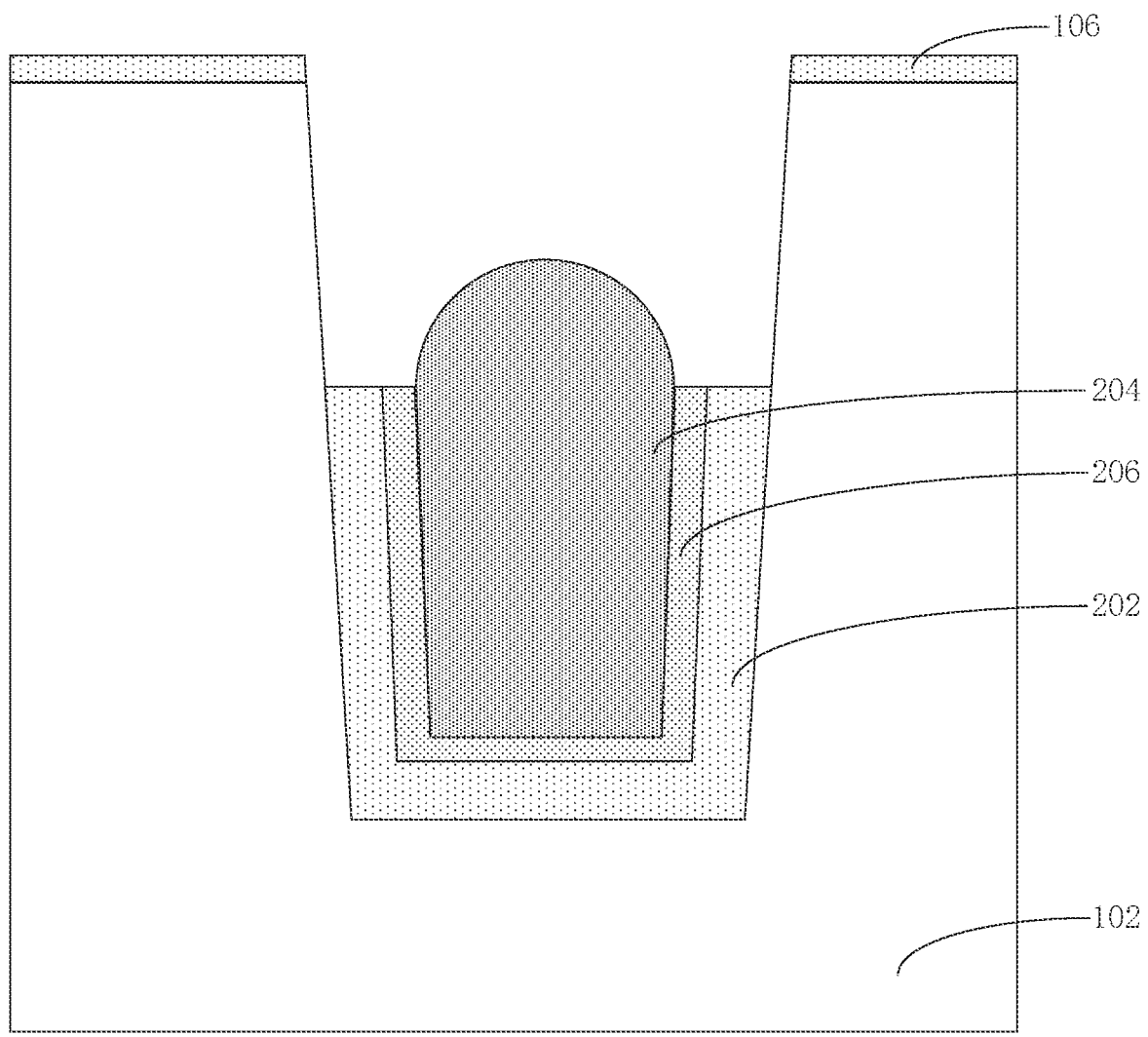
FIG. 5 is a schematic cross-sectional diagram of a semiconductor structure after a first conductive layer is formed according to a first embodiment.
Figure 6:
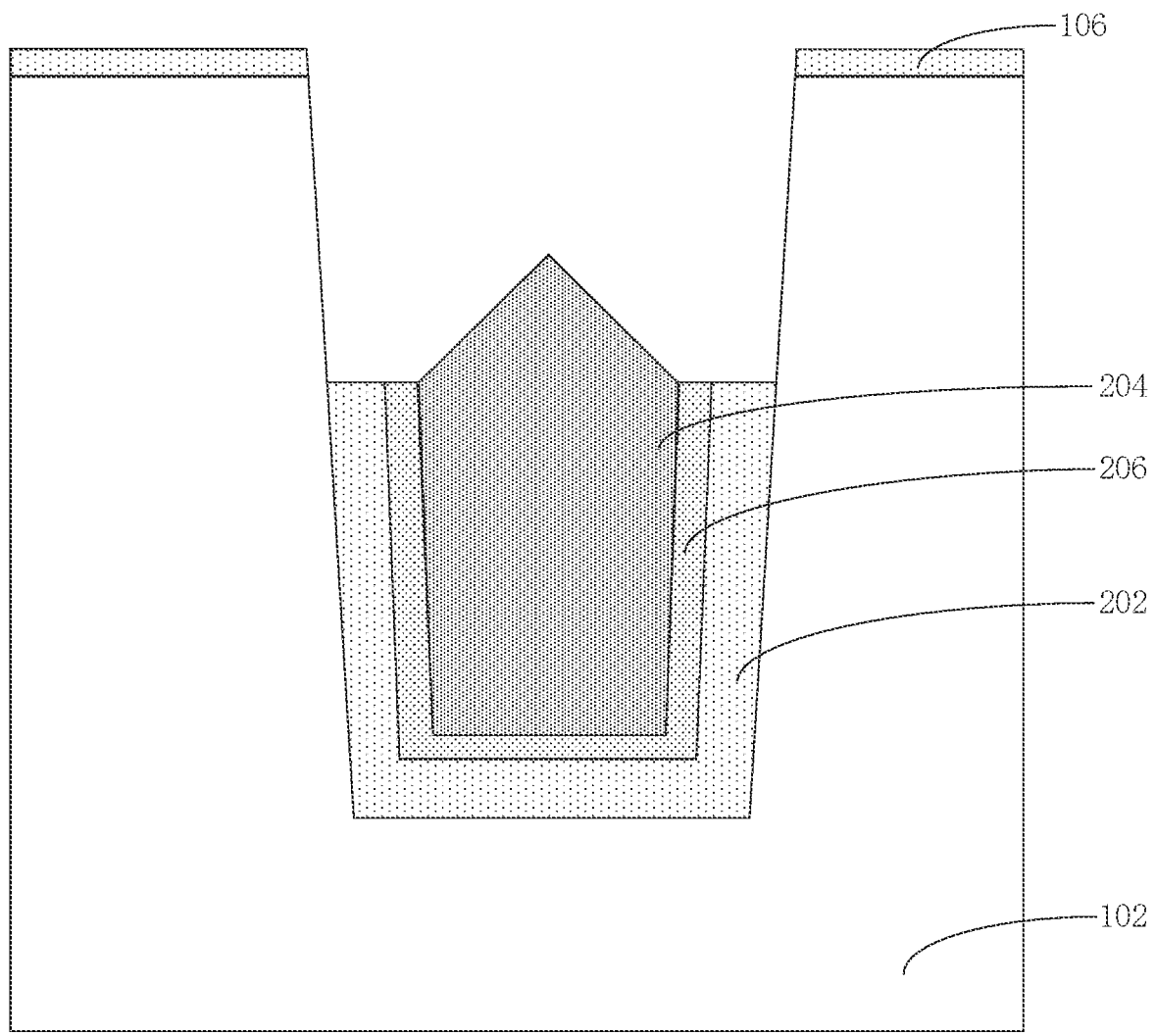
FIG. 6 is a schematic cross-sectional diagram of a semiconductor structure after a first conductive layer is formed according to a second embodiment.
Figure 7:
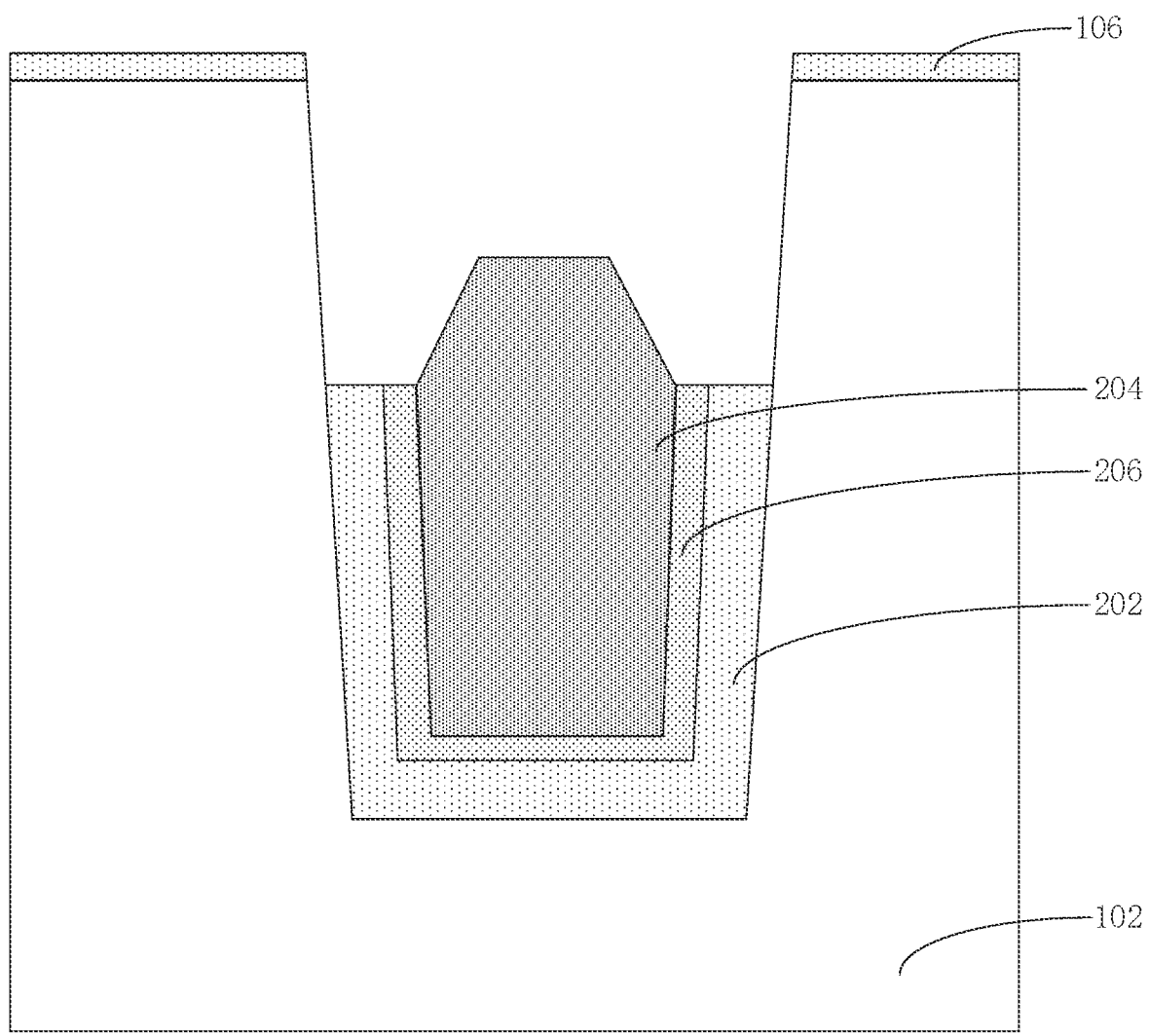
FIG. 7 is a schematic cross-sectional diagram of a semiconductor structure after a first conductive layer is formed according to a third embodiment.
Figure 8:
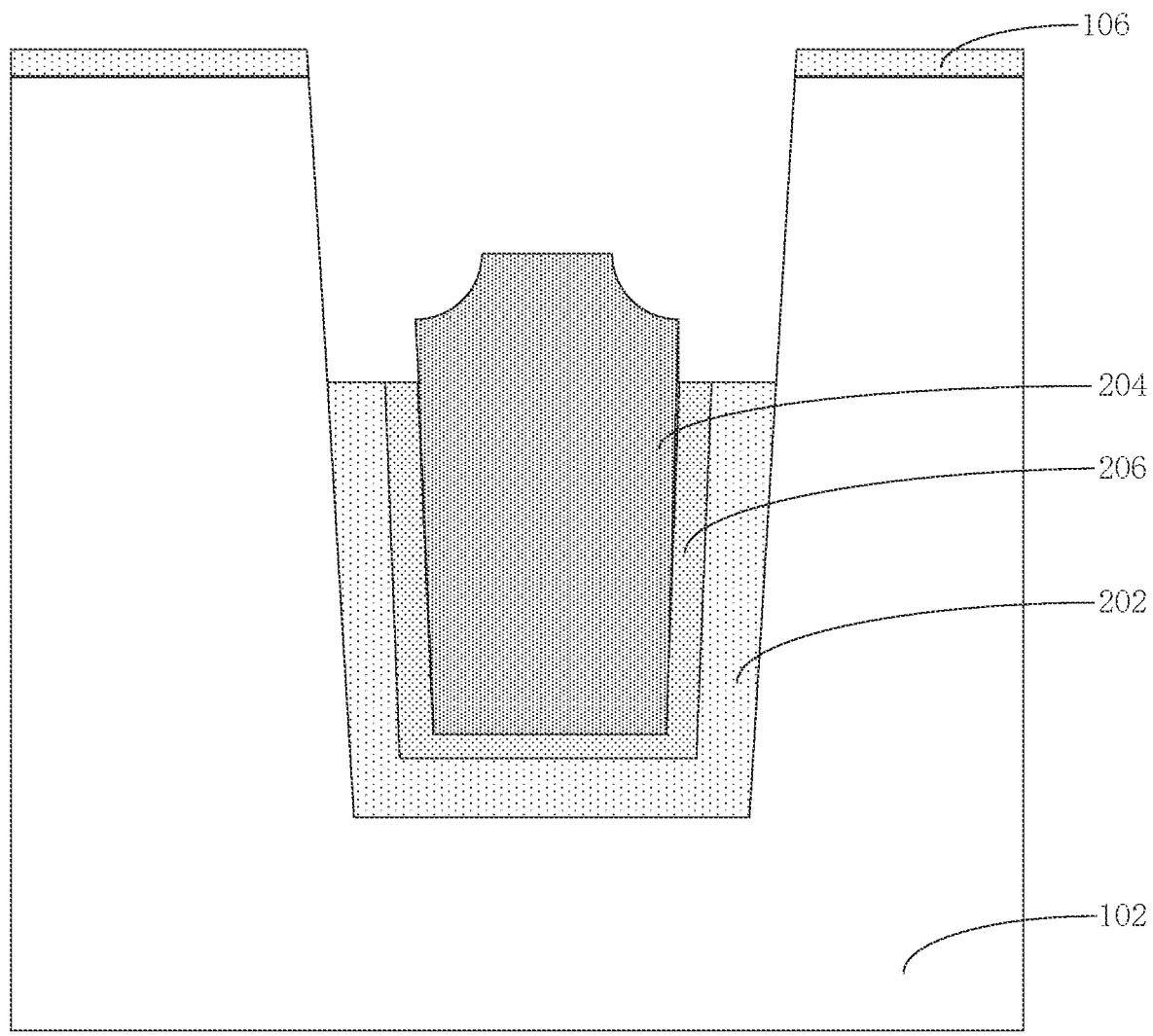
FIG. 8 is a schematic cross-sectional diagram of a semiconductor structure after a first conductive layer is formed according to a fourth embodiment.

FIG. 3 is a schematic flow diagram of Step S202 according to one embodiment, FIG. 4 is a schematic cross-sectional diagram of a semiconductor structure after a first conductive material layer is formed according to one embodiment, FIG. 5 is a schematic cross-sectional diagram of a semiconductor structure after the first conductive layer is formed according to a first embodiment, FIG. 6 is a schematic cross-sectional diagram of a semiconductor structure after the first conductive layer is formed according to a second embodiment, FIG. 7 is a schematic cross-sectional diagram of a semiconductor structure after the first conductive layer is formed according to a third embodiment, and FIG. 8 is a schematic cross-sectional diagram of a semiconductor structure after the first conductive layer is formed according to a fourth embodiment. As shown in FIG. 3, FIG. 4 and FIG. 5, as an example, Step S202 includes:

Step S302: forming a dielectric material layer on the inner wall of the trench.

In some embodiments, first, a substrate 102 having a trench 104 is provided. A depth and a feature dimension of the trench 104 may be set as desired in practical processes. For example, the depth of the trench 104 may be 50 nm to 300 nm, such as 50 nm, 70 nm, 90 nm, 100 nm, 150 nm, 200 nm, 250 nm, and 300 nm. The feature dimension of the trench 104 may be 20 nm to 100 nm, such as 0 nm, 30 nm, 50 nm, 70 nm, 90 nm, and 100 nm. Next, the dielectric material layer 106 is formed on the inner wall of the trench 104, and the dielectric material layers 106 on the opposite side walls of the trench 104 are isolated from each other. In some embodiments, the dielectric material layer 106 extends along the side wall of the trench 104 to cover the substrate 102. For example, the dielectric material layer 106 may be formed by means of an oxidation annealing process (ISSG), a thermal oxidation process, or a chemical vapor deposition process.

Step S304: forming a first conductive material layer in the trench.

In some embodiments, by means of a film forming process well known to those skilled in the art, such as a chemical vapor deposition process, an atomic layer deposition process and a physical vapor deposition process, a first conductive material layer 108 is formed in a trench 104, where the first conductive material layer 108 covers the dielectric material layer 106 and fills up the trench 104. It is to be understood that, in some embodiments, an upper surface of the first conductive material layer 108 is higher than that of the substrate 102.

Step S306: etching to form the dielectric layer and the first conductive layer.

Next, the dielectric material layer 106 and the first conductive material layer 108 are etched to remove the redundant dielectric material layer 106 and the redundant first conductive material layer 108, where the remaining dielectric material layer 106 is the dielectric layer 202, and the remaining first conductive material layer 108 is the first conductive layer 204. For example, a dry etching process or a wet etching process may be selected for etching.

As shown in FIG. 4 and FIG. 5, as an example, before Step S304, the method includes: forming a diffusion barrier material layer 110 in the trench 104, where the diffusion barrier material layer 110 is positioned between the first conductive material layer 108 and the dielectric material layer 106. Step S306 further includes: etching the diffusion barrier material layer 110 to obtain a diffusion barrier layer 206, where an upper surface of the diffusion barrier layer 206 is flush with an upper surface of the dielectric layer 202.

In some embodiments, after the dielectric material layer 106 is formed on the inner wall of the trench 104, the diffusion barrier material layer 110 is formed on the dielectric material layer 106, and the diffusion barrier material layer 110 does not fill up the space between the dielectric material layers 106 formed on the side walls of the trench 104. In some embodiments, the diffusion barrier material layer 110 is positioned on the upper surface of the dielectric material layer 106. That is, the diffusion barrier material layer 110 is in contact with the dielectric material layer 106. For example, a material of the diffusion barrier material layer 110 includes at least one of titanium, titanium nitride, tantalum, or tantalum nitride. In this case, the diffusion barrier material layer 110 may simultaneously act as an adhesive layer between the first conductive material layer 108 and the dielectric material layer 106, thereby achieving the objective of improving bonding performance between the first conductive material layer 108 and the dielectric material layer 106 and preventing delamination cracking. Next, the first conductive material layer 108 filling up the trench 104 is formed on the diffusion barrier material layer 110. Next, the redundant dielectric material layer 106, the redundant diffusion barrier material layer 110, and the redundant first conductive material layer 108 are removed by means of a dry etching process and/or a wet etching process. The remaining dielectric material layer 106 is the dielectric layer 202, the remaining diffusion barrier material layer 110 is the diffusion barrier layer 206, and the remaining first conductive material layer 108 is the first conductive layer 204. In some embodiments, before the dielectric layer 202, the diffusion barrier layer 206, and the first conductive layer 204 are obtained by etching, the first conductive layer 204 having a different top shape is obtained while the diffusion barrier layer 206 having an upper surface flush with the upper surface of the dielectric layer 202 is obtained by adjusting the etching selectivity of the diffusion barrier material layer 110 and the first conductive material layer 108 etched by means of dry etching.

As an example, the shape of the top of the first conductive layer comprises at least one of Ω (as shown in FIG. 5), a triangle (as shown in FIG. 6), a trapezoid (as shown in FIG. 7), and π (as shown in FIG. 8). An exemplary description is made below by taking an example where the shape of the top of the first conductive layer is Ω.

Step S204: forming a second conductive layer on the upper surface of the first conductive layer.

Figure 9:
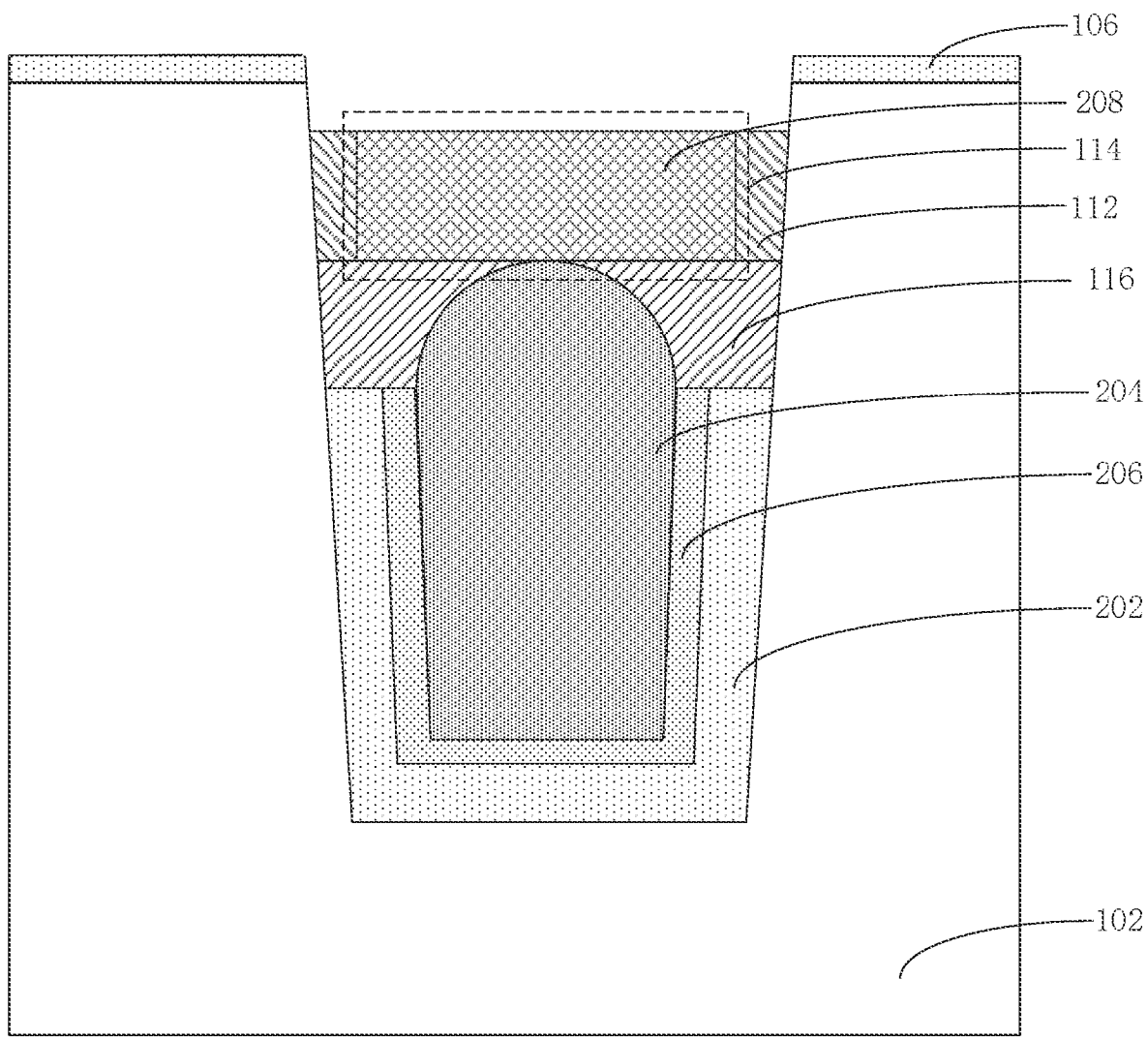
FIG. 9 is a schematic cross-sectional diagram of a semiconductor structure after a second conductive layer is formed according to one embodiment.
Figure 10:
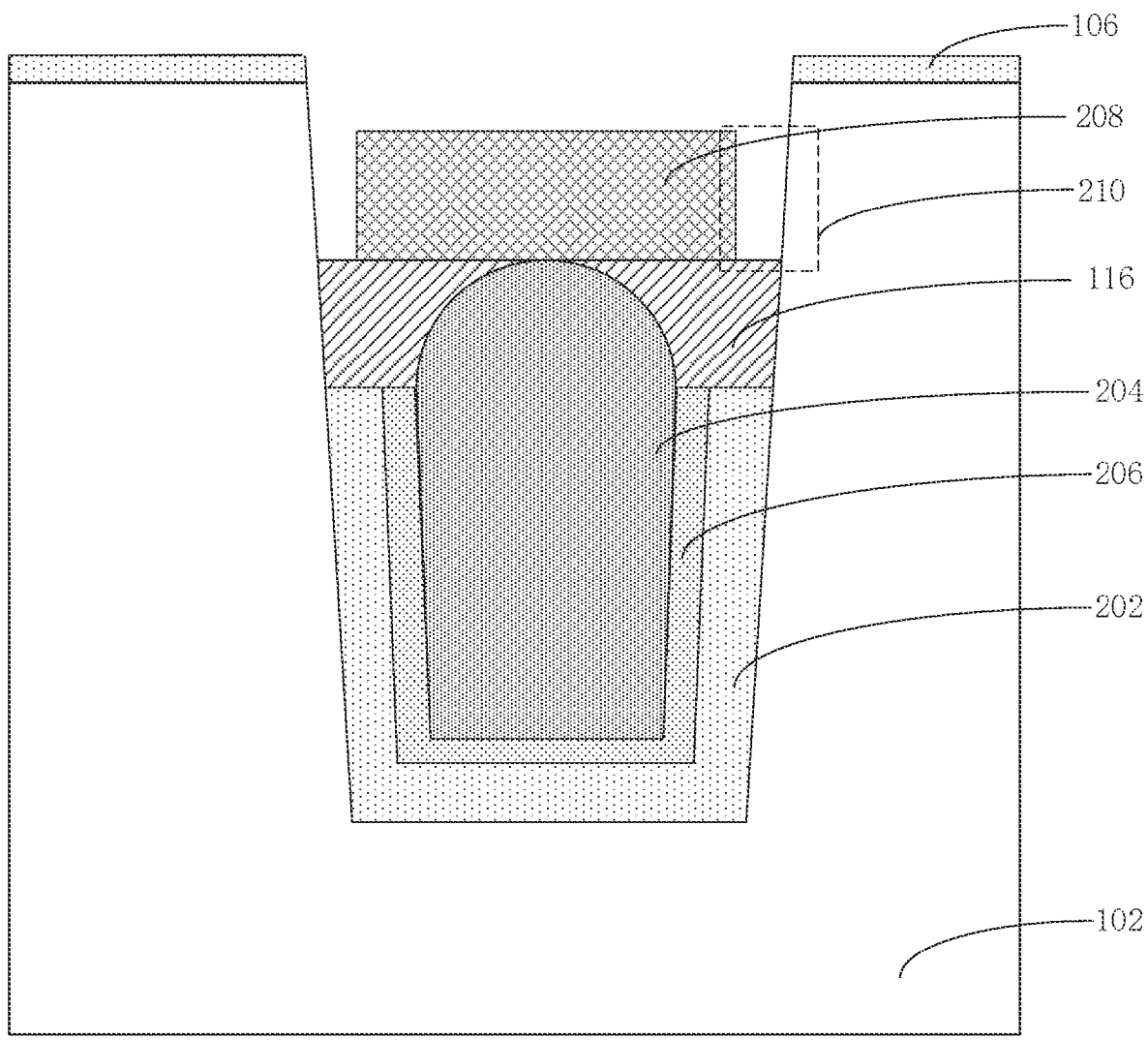
FIG. 10 is a schematic cross-sectional diagram of a semiconductor structure after a first void is formed according to one embodiment corresponding to FIG. 9.
Figure 11:
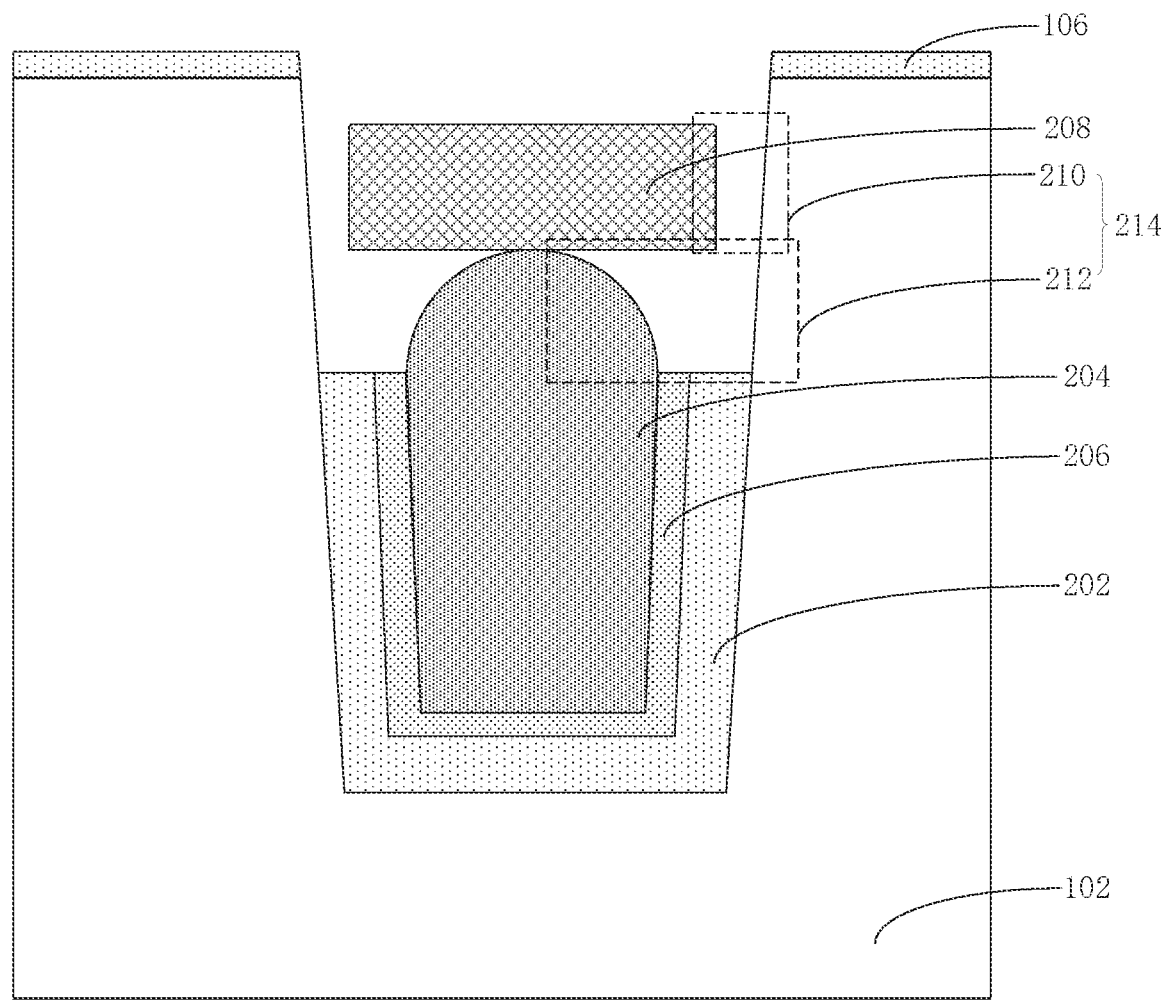
FIG. 11 is a schematic cross-sectional diagram of a semiconductor structure after a second void is formed according to one embodiment corresponding to FIG. 10.
Figure 12:
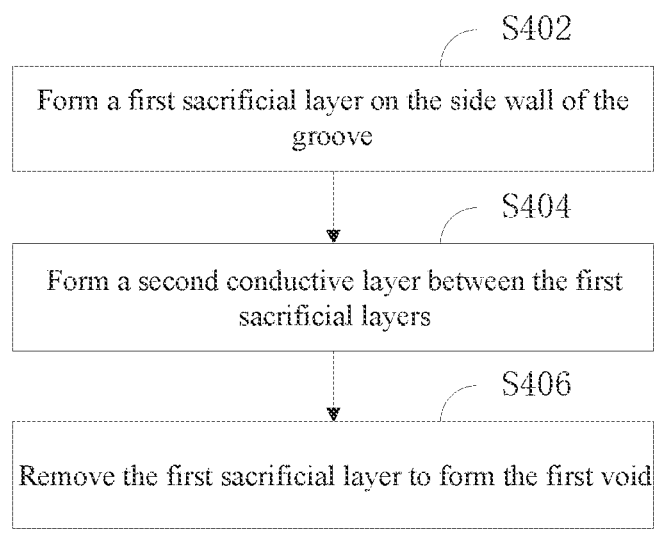
FIG. 12 is a schematic flow diagram of Step S204 according to one embodiment.
Figure 13:
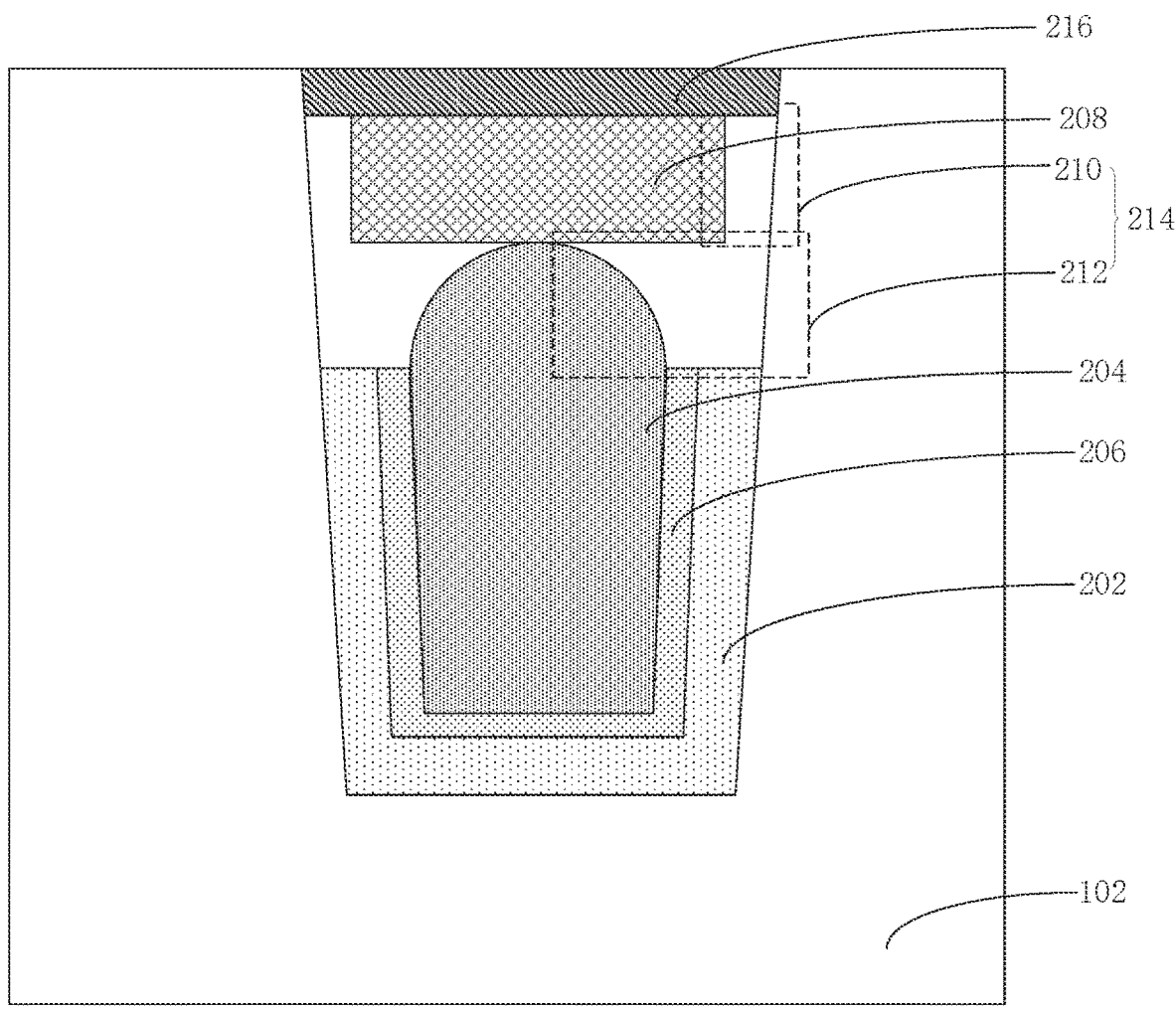
FIG. 13 is a schematic cross-sectional diagram of a semiconductor structure after an isolation layer is formed according to one embodiment corresponding to FIG. 11.

FIG. 9 is a schematic cross-sectional diagram of a semiconductor structure after the second conductive layer is formed according to one embodiment, FIG. 10 is a schematic cross-sectional diagram of a semiconductor structure after a first void is formed according to one embodiment corresponding to FIG. 9, FIG. 11 is a schematic cross-sectional diagram of a semiconductor structure after a second void is formed according to one embodiment corresponding to FIG. 10, FIG. 12 is a schematic flow diagram of Step S204 according to one embodiment, and FIG. 13 is a schematic cross-sectional diagram of a semiconductor structure after an isolation layer is formed according to one embodiment corresponding to FIG. 11. As shown in FIG. 9, a second conductive layer 208 is formed on the upper surface of the first conductive layer 204, a first void 210 is formed between the second conductive layer 208 and a side wall of the trench 104, and a second void 212 is formed between the first conductive layer 204 and the side wall of the trench 104.

As an example, in the direction perpendicular to the surface of the substrate, a projection area of the first void 210 within the trench 102 is less than that of the second void 212 within the trench 102. That is, the projection area of the orthographic projection of the first void 210 within the trench 102 is less than that of the orthographic projection of the second void 212 within the trench 102.

As shown in FIG. 9, FIG. 10, FIG. 11, FIG. 12 and FIG. 13, as an example, Step S204 includes following steps.

Step S402: forming a first sacrificial layer on the side wall of the groove.

A first sacrificial layer 112 is formed on the side wall of the trench 104, where the first sacrificial layer 112 is positioned above the dielectric layer 202, and a gap 114 is provided between the first sacrificial layers 112 on the opposite side walls of the trench 104. For example, a material of the first sacrificial layer 112 includes a nitride or an oxide such as silicon dioxide or silicon nitride. As an example, the material of the first sacrificial layer 112 includes silicon dioxide, and the material of the first sacrificial layer 112 may be formed by means of a thermal oxidation process, a chemical vapor deposition process, or an atomic layer deposition process, where the gap 114 between the first sacrificial layers 112 on the opposite side walls of the trench 104 may be obtained by means of photolithography and etching processes. In some embodiments, a distance between a side of the first sacrificial layer 112 distant from the trench 104 and the side wall of the trench 104 is 0.5 nm to 2 nm, for example, 0.5 nm, 0.7 nm, 0.8 nm, 0.9 nm, 1.0 nm, 1.5 nm, 1.7 nm, and 2.0 nm.

As an example, before Step S402, the method further includes: forming a second sacrificial layer 116 on the upper surface of the dielectric layer, where the second sacrificial layer 116 surrounds the first conductive layer 204, the first conductive layer 204 is exposed at a top of the second sacrificial layer 116, and a bottom of the first sacrificial layer 112 is flush with the top of the second sacrificial layer 116.

As an example, a material of the second sacrificial layer 116 includes a nitride or an oxide such as silicon dioxide or silicon nitride. In some embodiments, the second sacrificial layer 116 and the first sacrificial layer 112 are made of the same material. In this case, the first sacrificial layer 112 and the second sacrificial layer 116 may be removed by twice etching respectively, thereby achieving the objective of completely removing the first sacrificial layer 112 and the second sacrificial layer 116. The first sacrificial layer 112 and the second sacrificial layer 116 may also be removed simultaneously by means of single etching, thereby achieving the objective of simplifying the fabrication process of the semiconductor structure. In some other embodiments, the second sacrificial layer 116 and the first sacrificial layer 112 are made of different materials. In this case, the first sacrificial layer 112 and the second sacrificial layer 116 may be respectively removed by twice etching. In this case, the first sacrificial layer 112 and the second sacrificial layer 116 may be removed by different etching steps, thereby achieving the objective of completely removing the first sacrificial layer 112 and the second sacrificial layer 116.

Step S404: forming a second conductive layer between the first sacrificial layers.

A second conductive layer 208 is formed in the gap 114, where the second conductive layer 208 fills up the gap 114, and the second conductive layer 208 is in contact with the first conductive layer 204.

In some embodiments, the second conductive layer 208 is formed by means a chemical vapor deposition process, a physical vapor deposition process, or an atomic layer deposition process. For example, a material of the second conductive layer 208 includes doped polysilicon, and in some embodiments, the doped polysilicon is formed by means of deposition while doping.

Step S406: removing the first sacrificial layer to form the first void.

The first sacrificial layer 112 on the side wall of the trench 104 is removed by means of a dry etching process or a wet etching process to obtain the first void 210.

As an example, before Step S106, the method further comprises: removing the second sacrificial layer 116 to form the second void 212. In some embodiments, as shown in FIG. 10 and FIG. 11, the first void 210 formed after the first sacrificial layer 112 is removed by means of the wet etching process or the dry etching process exposes part of the surface of the second sacrificial layer 116, and the second sacrificial layer 116 positioned on the dielectric layer 202 and the diffusion barrier layer 206 is removed by means of the dry etching process or the wet etching process to form the second void 212 positioned between the first conductive layer 204 and the side wall of the trench 104. For example, when the material of the first sacrificial layer 112 is silicon dioxide and the material of the second sacrificial layer 116 is silicon nitride, after the first sacrificial layer 112 is completely removed by means of the dry etching process or the wet etching process, the second sacrificial layer 116 is removed by means of the wet etching process with an etching liquid including hot phosphoric acid. Next, an isolation layer 216 is formed on the second conductive layer 208. It is to be understood that, when the isolation layer 216 is positioned on the second conductive layer 208, a lower surface of the isolation layer 216 may be flush with an upper surface of the second conductive layer 208.

As an example, the top of the isolation layer 216 is flush with the top of the trench 104. For example, a material of the isolation layer 216 includes a nitride or an oxide such as silicon dioxide or silicon nitride. The isolation layer 216 is formed by means of a chemical vapor deposition process, a physical vapor deposition process, or an atomic layer deposition process. It is to be understood that, to obtain the isolation layer 216 having a flat surface, the isolation layer 216 having the flat surface is obtained by means of a chemical mechanical polishing process after deposition. When the dielectric material layer 106 is retained on the substrate 102, the dielectric material layer 106 on the substrate 102 is removed while the isolation layer 216 having the flat surface is obtained by means of the chemical mechanical grinding process.

As an example, the top of the conductive layer is lower than the top of the trench 102.

As an example, a projection area of the top of the second conductive layer 208 within the trench 102 is equal to a projection area of the bottom of the second conductive layer 208 within the trench 102.

It is to be understood that although the various steps in the flowcharts of FIG. 1, FIG. 2, FIG. 3 and FIG. 12 are displayed in sequence as indicated by the arrows, these steps are not necessarily performed in sequence in the order indicated by the arrows. Unless expressly stated herein, the execution of these steps is not strictly restrictive and may be performed in other order. Moreover, at least some of the steps in FIG. 1, FIG. 2, FIG. 3 and FIG. 12 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

As shown in FIGS. 4 and 13, the embodiments of the present disclosure provide a semiconductor structure, which includes a substrate 102, a conductive layer, a dielectric layer 202, an isolation layer 216, and a void 214. A trench 104 is formed in the substrate 102; the conductive layer is positioned in the trench 104, and the conductive layer includes a first conductive layer 204 and a second conductive layer 208, where the second conductive layer 208 is positioned on the first conductive layer 204, and a projection area of a bottom of the second conductive layer 208 within the trench 104 is greater than a projection area of a top of the first conductive layer 204 within the trench 104. The dielectric layer 202 is positioned between the conductive layer and an inner wall of the trench 104, where a top of the dielectric layer 202 is lower than the top of the first conductive layer 204. The isolation layer 216 is positioned on the conductive layer; and the void 214 defined by the isolation layer 216, the conductive layer, the dielectric layer 202, and a side wall of the trench 104, where a work function of the first conductive layer 204 is greater than a work function of the second conductive layer 208.

In some embodiments, the substrate 102 may use undoped single crystal silicon, single crystal silicon doped with impurities, silicon-on-insulator (SOI), stacked silicon-on-insulator (SSOI), stacked silicon-germanium-on-insulator (S—SiGeOI), silicon-germanium-on-insulator (SiGeOI), and germanium-on-insulator (GeOI), etc. As an example, in this embodiment, a material for forming the substrate 102 is single crystal silicon. The dielectric layer 202 covers part of the side wall of the trench 104 close to the bottom and the bottom of the trench 104, and the conductive layer is filled between the dielectric layers 202 on the side wall. The upper surface of the conductive layer is higher than that of the dielectric layer 202. From the bottom of the trench 104 to the opening direction of the trench 104, the conductive layer includes the first conductive layer 204 close to the bottom of the trench 104 and the second conductive layer 208 close to the top of the trench 104. The first conductive layer 204 is electrically connected to the second conductive layer 208, and the area of the orthographic projection of the bottom of the second conductive layer 208 within the trench 104 is greater than that of the top of the first conductive layer 204 within the trench 104. That is, in the direction parallel to the upper surface of the substrate 102, the cross-sectional area of the bottom of the second conductive layer 208 is greater than that of the top of the first conductive layer 204. For those skilled in the art, when the semiconductor structure includes a memory device, the conductive layer serves as the gate of the memory transistor, and moreover, the conductive layer may serve as a word line structure of the memory device. It is to be understood that, the side wall of the second conductive layer 208 is isolated from that of the trench. The isolation layer 216 is formed on the conductive layer. The isolation layer 216 is in contact with the side wall of the trench 104. In this case, the void 214 is formed in an unfilled part of space defined by the isolation layer 216, the conductive layer, the dielectric layer 202, and the side wall of the trench 102. In this case, the void 214 and the dielectric layer 202 jointly serve as the gate dielectric layer of the memory transistor, thereby reducing the drain-to-gate voltage, effectively inhibiting the GIDL, improving the reliability of the semiconductor structure, and reducing the power consumption of the semiconductor structure. When the semiconductor structure is a memory device, data storage and read/write performance of the memory device is improved.

The semiconductor structure includes: a substrate, where a trench is formed in the substrate; a conductive layer positioned in the trench, where the conductive layer includes a first conductive layer and a second conductive layer, the second conductive layer is positioned on the first conductive layer, and a projection area of a bottom of the second conductive layer within the trench is greater than a projection area of a top of the first conductive layer within the trench; a dielectric layer positioned between the conductive layer and an inner wall of the trench, where a top of the dielectric layer is lower than the top of the first conductive layer; an isolation layer positioned on the conductive layer; and a void defined by the isolation layer, the conductive layer, the dielectric layer, and a side wall of the trench, where a work function of the first conductive layer is greater than a work function of the second conductive layer. In the present disclosure, the conductive layer serving as a gate structure includes the first conductive layer and the second conductive layer, and the work function of the first conductive layer is greater than that of the second conductive layer. In this way, turn-on speed of the memory transistor is improved, the GIDL of the semiconductor structure is reduced, the reliability of the semiconductor structure is reduced, and the power consumption of the semiconductor structure is reduced, such that the data storage and read/write performance of the semiconductor structure is improved. Moreover, in the present disclosure, the gate dielectric layer of the memory transistor includes the void and the dielectric layer, thereby reducing the drain-to-gate voltage, inhibiting the GIDL, and achieving the objective of further improving the reliability of the semiconductor structure and reducing the power consumption of the semiconductor structure. Furthermore, the data storage and read/write performance of the semiconductor structure is further improved.

As an example, a shallow trench isolation structure is formed in the substrate 102, where the shallow trench isolation structure isolates a plurality of active areas arranged at intervals in the substrate 102, the trench 104 is formed in each of the plurality of active areas, and a source/drain region is formed on two opposite sides of the trench 104 respectively.

As an example, the bottom of the void 214 is not lower than the top of the source/drain region. That is, the bottom of the void 214 is higher than or as high as the top of the source/drain region, and the void 214 does not extend into the substrate on a lower layer of the source/drain region. The substrate 102 is isolated from the conductive layer by the dielectric layer 202. For example, the dielectric layer 202 may be a silicon dioxide dielectric layer. In other embodiments of the present disclosure, the void 214 may further extend into the substrate 102 on the lower layer of the source/drain region. That is, portion of a region between the substrate 102 and the conductive layer is isolated by the void 214. The above difference determines the composition of the isolation medium for the gate-drain overlapping region and part of the channel region of the transistor structure obtained in the present disclosure, and the selection of the isolation medium may have an important influence on the performance of the transistor such as GIDL and switching characteristics. In this embodiment, the isolation dielectric in the channel region may entirely comprise a silicon dioxide gate dielectric layer, which ensures that the device obtained has better switching characteristics.

As an example, the shape of the top of the first conductive layer comprises at least one of Ω (as shown in FIG. 5), a triangle (as shown in FIG. 6), a trapezoid (as shown in FIG. 7), and π (as shown in FIG. 8). An exemplary description is made below by taking an example where the shape of the top of the first conductive layer is Ω.

As an example, the void 214 includes a first void 210 and a second void 212, where the first void 210 is positioned between the second conductive layer 208 and the side wall of the trench 102, and the second void 212 is positioned between the first conductive layer 204 and the side wall of the trench 102. For example, a material of the dielectric layer 202 includes silicon dioxide. A material of the first conductive layer 204 includes tungsten.

A depth and a feature dimension of the trench 104 may be set as desired in practical processes. For example, the depth of the trench 104 may be 50 nm to 300 nm, such as 50 nm, 70 nm, 90 nm, 100 nm, 150 nm, 200 nm, 250 nm, and 300 nm. The feature dimension of the trench 104 may be 20 nm to 100 nm, such as 0 nm, 30 nm, 50 nm, 70 nm, 90 nm, and 100 nm.

As an example, the semiconductor structure further includes a diffusion barrier layer 206 positioned between the conductive layer and the dielectric layer 202, where an upper surface of the diffusion barrier layer 206 is flush with that of the dielectric layer 202. In some embodiments, the diffusion barrier layer 206 follows the dielectric layer 202. That is, the diffusion barrier layer 206 is in contact with the dielectric layer 202. For example, a material of the diffusion barrier layer 206 includes at least one of titanium and titanium nitride. In this case, the diffusion barrier layer 206 may also serve as an adhesive layer between the first conductive material layer 204 and the dielectric layer 202, thereby achieving the objective of improving bonding performance between the first conductive material layer 204 and the dielectric layer 202 and preventing delamination cracking.

As an example, in the direction perpendicular to the surface of the substrate, the projection area of the first void 210 within the trench 102 is less than that of the second void 212 within the trench 102. That is, the projection area of the orthographic projection of the first void 210 within the trench 102 is less than that of the second void 212 within the trench 102.

As an example, the material of the second conductive layer 208 includes doped polysilicon.

As an example, the isolation layer 216 is positioned on the upper surface of the second conductive layer 208, and the lower surface of the isolation layer 216 is flush with the upper surface of the second conductive layer 208.

As an example, the top of the isolation layer 216 is flush with the top of the trench 102. For example, a material of the isolation layer 216 includes a nitride or an oxide such as silicon dioxide or silicon nitride.

As an example, the top of the conductive layer is lower than the top of the trench 102. For example, the conductive layer includes a first conductive layer 204 and a second conductive layer 208, where the top of the second conductive layer 208 is lower than the top of the trench 102.

As an example, a projection area of the top of the second conductive layer 208 within the trench 102 is equal to a projection area of the bottom of the second conductive layer 208 within the trench 102.

As an example, the semiconductor structure includes a dynamic random access memory.

Embodiments of the present disclosure provide an electronic device, which comprises the semiconductor structure as described in any one of the above embodiments.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, patent protection scope of the embodiments of the present disclosure shall be subject to the appended claims.

What is claimed is:

1. A method for fabricating a semiconductor structure, comprising:
providing a substrate, wherein a trench is formed in the substrate;
sequentially forming a dielectric layer and a conductive layer in the trench, wherein the dielectric layer is positioned between the conductive layer and an inner wall of the trench; and the conductive layer comprises a first conductive layer and a second conductive layer positioned on the first conductive layer, a top of the dielectric layer being lower than a top of the first conductive layer, a projection area of a bottom of the second conductive layer within the trench being greater than a projection area of the top of the first conductive layer within the trench, and a work function of the first conductive layer being greater than a work function of the second conductive layer; and
forming an isolation layer on the conductive layer, wherein the isolation layer, the conductive layer, the dielectric layer, and a side wall of the trench define a void;
wherein the void comprises a first void and a second void; and the sequentially forming the dielectric layer and the conductive layer in the trench comprises:
sequentially forming the dielectric layer and the first conductive layer in the trench; and
forming the second conductive layer on an upper surface of the first conductive layer, wherein the first void is provided between the second conductive layer and the side wall of the trench, and the second void is provided between the first conductive layer and the side wall of the trench;
wherein the forming the second conductive layer on the upper surface of the first conductive layer comprises:
forming a first sacrificial layer on the side wall of the trench, wherein the first sacrificial layer is positioned above the dielectric layer, and a gap is provided between portions of the first sacrificial layer on opposite side walls of the trench;
forming the second conductive layer in the gap, wherein the second conductive layer fills up the gap, and the second conductive layer is in contact with the first conductive layer; and
removing the first sacrificial layer to form the first void;
wherein before forming the first sacrificial layer on the side wall of the trench, the method further comprises:
forming a second sacrificial layer on an upper surface of the dielectric layer, wherein the second sacrificial layer surrounds the first conductive layer, the first conductive layer is exposed at a top of the second sacrificial layer, and a bottom of the first sacrificial layer is flush with the top of the second sacrificial layer;
wherein before forming the isolation layer on the conductive layer, the method further comprises:
removing the second sacrificial layer to form the second void.

2. The method according to claim 1, wherein a shallow trench isolation structure is formed in the substrate, the shallow trench isolation structure isolating a plurality of active areas arranged at intervals in the substrate, the trench being formed in each of the plurality of active areas, and a source/drain region being formed on two opposite sides of the trench respectively.

3. The method according to claim 1, wherein a top of the isolation layer is flush with a top of the trench.

4. The method according to claim 1, wherein the sequentially forming the dielectric layer and the first conductive layer in the trench comprises:
forming a dielectric material layer on the inner wall of the trench;
forming a first conductive material layer in the trench, wherein the first conductive material layer covers the dielectric material layer and fills up the trench; and
etching the dielectric material layer and the first conductive material layer to form the dielectric layer and the first conductive layer.

5. The method according to claim 4, wherein before forming the first conductive material layer in the trench, the method further comprises:

forming a diffusion barrier material layer in the trench, wherein the diffusion barrier material layer is positioned between the first conductive material layer and the dielectric material layer; and the etching the dielectric material layer and the first conductive material layer comprises:

etching the diffusion barrier material layer to obtain a diffusion barrier layer, wherein an upper surface of the diffusion barrier layer is flush with the upper surface of the dielectric layer.

6. The method according to claim 4, wherein a shape of the top of the first conductive layer comprises at least one of Ω, a triangle, a trapezoid, and π.

7. The method according to claim 1, wherein in a direction perpendicular to a surface of the substrate, a projection area of the first void within the trench is less than a projection area of the second void within the trench.

8. The method according to claim 1, wherein a top of the conductive layer is lower than the top of the trench.

9. The method according to claim 1, wherein a projection area of a top of the second conductive layer within the trench is equal to a projection area of the bottom of the second conductive layer within the trench.

* * * * *